(12) United States Patent
Jonas et al.

(10) Patent No.: US 8,307,997 B2
(45) Date of Patent: Nov. 13, 2012

(54) MOUNTING DEVICE FOR DISK-SHAPED SUBSTRATES SUCH AS SOLAR WAFERS

(75) Inventors: Stefan Jonas, Berlin (DE); Lutz Redmann, Kleinmachnow (DE)

(73) Assignee: Johas & Redmann Automationstechnik GmbH, Berlin (DE)

( * ) Notice: Subject to any disclaimer, the term of this patent is extended or adjusted under 35 U.S.C. 154(b) by 356 days.

(21) Appl. No.: 12/674,837

(22) PCT Filed: Aug. 30, 2008

(86) PCT No.: PCT/EP2008/007321
§ 371 (c)(1),
(2), (4) Date: Feb. 23, 2010

(87) PCT Pub. No.: WO2009/030494
PCT Pub. Date: Mar. 12, 2009

(65) Prior Publication Data
US 2011/0114810 A1    May 19, 2011

(30) Foreign Application Priority Data
Aug. 31, 2007 (DE) ..................... 20 2007 012 384 U

(51) Int. Cl.
*A47G 19/08* (2006.01)
(52) U.S. Cl. .................................................. 211/41.18
(58) Field of Classification Search ............... 211/41.18, 211/70.8, 67, 10, 49.1; 206/710, 454, 832; 414/935
See application file for complete search history.

(56) References Cited

U.S. PATENT DOCUMENTS

| | | | | | |
|---|---|---|---|---|---|
| 2,436,687 | A | * | 2/1948 | Corbett | 206/315.6 |
| 4,566,839 | A | * | 1/1986 | Butler | 414/404 |
| 4,960,212 | A | * | 10/1990 | Wu | 211/70.2 |
| 4,981,222 | A | * | 1/1991 | Lee | 211/41.18 |
| 4,993,559 | A | * | 2/1991 | Cota | 211/41.18 |
| 5,505,316 | A | * | 4/1996 | Lee | 211/70.6 |
| 5,534,074 | A | * | 7/1996 | Koons | 118/728 |
| 5,617,951 | A | * | 4/1997 | Wick | 206/315.6 |
| 6,536,588 | B1 | * | 3/2003 | Kyrwood | 206/315.6 |
| 7,007,812 | B1 | * | 3/2006 | Spann | 211/70.6 |
| 7,237,685 | B2 | * | 7/2007 | Keegan et al. | 211/70.8 |
| 2003/0121533 | A1 | * | 7/2003 | Bottos et al. | 134/25.4 |
| 2004/0022607 | A1 | * | 2/2004 | Lim et al. | 414/222.01 |
| 2006/0027513 | A1 | * | 2/2006 | Jun et al. | 211/41.18 |
| 2007/0125726 | A1 | * | 6/2007 | Seo | 211/41.18 |

FOREIGN PATENT DOCUMENTS
WO    WO 03041880 A1 *  5/2003
* cited by examiner

*Primary Examiner* — Jennifer E. Novosad
(74) *Attorney, Agent, or Firm* — Notaro, Michalos & Zaccaria P.C.

(57) ABSTRACT

A Mounting device for disk-shaped substrates (2) with a comb-like holder (1) having an elongated web (3), on which a plurality of comb elements (4) is arranged at equal distances from each other. Between the neighboring comb elements (4) a mounting gap (9) is formed which comprises an outer contour having two recesses (5; 6) that are offset from each other, and a contact surface (7) and a guiding surface (8) for the substrate to be inserted into the mounting gap (9). The outer contour of the two recesses (5; 6) comprises a groove (10) on the web-side with a slanted surface section (11) on the web-side that is located in a plane (10) running in an inclined manner at an acute angle relative to the plane of the contact surface (7) of the outer contour of the mounting gap (9).

15 Claims, 5 Drawing Sheets

MOUNTING DEVICE FOR DISK-SHAPED SUBSTRATES SUCH AS SOLAR WAFERS

The invention relates to a mounting device for disk-shaped substrates, such as solar wafers, with at least one comb-like holder having an elongated web, on which along the longitudinal extension (X-axis) thereof a plurality of comb elements arranged at equal distances from each other are provided, which relative to the longitudinal extension of the web protrude perpendicularly (Z-axis) over a uniform height and exhibit an identical total depth $t_{ges}$ corresponding to the width of the elongated web perpendicular (Y-axis) to the plane formed by the X and Z axis, wherein between the surfaces of neighboring comb elements facing each other at least one recess for the solar wafer to be mounted is formed with an outer contour, the middle axis of which runs in the direction of the Z-axis, and which exhibits a contact surface and a guiding surface, which are arranged relative to each other and parallel to the middle axis of the recess, for the solar wafer to be mounted in the recess.

One transfer device for chip components shaped like a rectangular cuboid known from DE 199 13 134 A1 provides a mounting device in the form of a transfer disk, the periphery of which exhibits a plurality of recesses arranged at equal distances from each other in the form of transfer grooves, in which a cuboidal chip element is held via aspirated air and moved to another operating position when turning the transfer disk. The peripheral edge section of each transfer groove incorporates a stepped hole-shaped cavity, which can hold only one chip component. Since the radial length of the cavity is shorter than the long side of the chip component, a portion of the chip component contained in the cavity projects from the peripheral surface side of the transfer disk. One step in the lower surface between the cavity and transfer groove is smaller than the width of the short side of the chip component. This controls the movement of sequential chip components toward the outer diameter of the transfer disk.

A device known from DE 199 06 805 B4 for transporting substrates to be machined, such as wafers, further provides a position-changing device, which has a pair of essentially rectangular holders spaced apart from each other, between which the wafers are to be arranged. Each holder is here provided on the side facing the other holder with a plurality of retaining grooves spaced reasonably apart in order to hold the wafers individually. The retaining grooves essentially have V-shaped cross sections, the opening sides of which are expanded in such a way as to prevent the retaining grooves and wafers from coming into contact as much as possible.

The object of the invention is to provide disk-shaped substrates, such as solar wafers, with a mounting device having at least one comb-like holder, to be designed in a technically simple and economical way with a respective mounting gap fabricated as tightly as desired between respectively neighboring comb elements for a reliable holding and mounting of the respective solar wafer to be mounted both on a defined side of a comb element, as well as in a defined height in the comb-like holder. In addition, the mounting device according to the invention is to enable a backlash-free fixation of the solar wafers held therein.

This object is achieved according to the invention by providing a mounting gap between the two respective neighboring comb elements of the elongated web of the at least one comb-like holder, the outer contour $u_S$ of which comprises the contact surface and guiding surface for the solar wafer to be accommodated in the mounting gap, formed in the direction of the X-axis with an arbitrary width by two recesses offset relative to each other in the direction of the X-axis, which have an outer contour $u_1$ or $u_2$, and a respective depth $t_1$ or $t_2$ smaller than the total depth $t_{ges}$ of each comb element, wherein the depth $t_1$ and the depth $t_2$ form the respective total depth $t_{ges}$ of each comb element, and the outer contour $u_1$ or $u_2$ has a groove on the web side with a slanted surface section on the web side that is located in a plane running in an inclined manner at an acute angle α relative to the plane of the contact surface of the mounting gap such that the solar wafer to be introduced into the mounting gap, when its lower edge engages with the slanted surface section of the groove of the outer contour $u_1$ or $u_2$, is to be glidingly shifted thereon into a predetermined position under the force of gravity while overcoming static friction, in which the solar wafer, upon rotating the comb-like holder around a predetermined acute angle relative to the vertical line on the outer contour $u_S$ of the mounting gap, is brought with its surface facing the latter in planar contact on the contact surface, and in which there is simultaneously provided a tolerance between the surface of the solar wafer facing away from the contact surface and the guiding surface of the outer contour $u_S$ of the mounting gap running parallel to the contact surface.

The depth $t_1$ and depth $t_2$ of the first recess or second recess between the respective comb elements neighboring each other are preferably identical, and the acute angle α can range from 46° to 50°, depending on the material pairing of the comb-like holder and the solar wafer. Measured in the direction of the X-axis, the width of the mounting gap is identical to the thickness of the solar wafer plus the tolerance.

The outer contour $u_S$ of the mounting gap can expand like a funnel into an opening area opposite to the direction in which the solar wafer is introduced by having the respective surfaces bordering the opening area that abut the guiding surface and the contact surface of the outer contour $u_S$ of the mounting gap as viewed in the longitudinal section of the comb-like holder be guided away from the guiding surface or from the contact surface at an acute angle β or γ within a range of 18° to 22° or within a range of 13° to 17°, wherein the opening area of the outer contour $u_1$ or $u_2$ of the first or second recess that has the groove on the web side is designed like a stepped hole.

In order to suitably ensure that each solar wafer comes to abut the contact surface of the outer contour $u_S$ of the corresponding mounting gap in a planar manner, the lower longitudinal edge of the web of the comb-like holder can be inclined relative to the vertical line on the contact surface of the outer contour $u_S$ of the mounting gap at an acute angle of 3°.

Each comb-like holder of the mounting device is preferably manufactured by machining a blank, e.g., one consisting of a flexible plastic, light metal or alloy of the latter and having the exterior dimensions of the finished comb-like holder, in such a way as to use a single milling cutter to completely fabricate the milling contour of the comb-like holder, initially in part starting from the one longitudinal side of the blank in the direction of the Y-axis to depth $t_1$, and after subsequently turning the partially milled blank by 180° around the Z-axis, completely fabricate the milling contour from its other longitudinal side in the direction of the Y-axis to depth $t_2$. It is also possible to simultaneously machine the blank for manufacturing the comb-like holder starting from both of its longitudinal sides by means of a respective milling cutter to be correspondingly positioned.

The comb-like holder according to the invention can also consist of two components to be fabricated simultaneously, the outer contour of which respectively corresponds to the outer contour $u_{Schnitt}$ of the two defined sheet metal blanks of the comb-like holder 1 given a longitudinal section of the latter, when the plane of the longitudinal section runs parallel to the X-axis at $y=t_1$ or $y=t_{ges}-t_2$, and which are detachably screwed to each other while abutting in a planar manner at their facing longitudinal sides.

As opposed to the conventional fabrication of the milling contour of a holder for thin parallel arranged substrates, e.g., silicon wafers, by means of a milling cutter in an operation in which the width of the mounting gap for each silicon wafer is defined by the thickness of the milling cutter, the comb-like holder of the mounting device according to the invention must be fabricated with as tight a mounting gap as desired. In addition, the milling contour of the comb-like holder ensures a planar abutment of all solar wafers to be held in the latter, both on a defined side of the outer contour of the mounting gap $u_S$, as well as at a defined height of the latter. As a result, the comb-like holder of the mounting device according to the invention for disk-shaped substrates such as solar wafers is relatively easy and economical to manufacture from a technical standpoint with a mounting gap of any width desired.

The mounting device according to the invention can have a paired arrangement of the comb-like holder, wherein the elongated webs of the two identically designed comb-like holders are to be arranged parallel at a distance from each other and aligned precisely relative to each other in the longitudinal profile for purposes of accommodating the solar wafer. At least one additional comb-like holder can suitably be provided, which is to be shifted in a controlled fashion in the longitudinal direction relative to the other comb-like holders in such a way that the solar wafer mounted in the mutually corresponding mounting gaps of the two fixed comb-like holders and the shiftable comb-like holder can be secured in a backlash-free position by the respective contact surface of the outer contour of the respectively corresponding mounting gap of the two comb-like holders and the guiding surface of the outer contour of the corresponding mounting gap of the shiftable comb-like holder.

The elongated web of each of the two mutually spaced apart and identically designed comb-like holders can preferably be designed as a single piece with a final connecting base section, the upper surface of which incorporates a longitudinally running guide centrally between the two comb-like holders, into which the elongated web of the shiftable comb-like holder can be controllably shifted with its lower longitudinal edge parallel and aligned in longitudinal profile relative to the respective elongated web of the two outlying comb-like holders.

In the backlash-free position of the solar wafer fixed by the comb-like holders, the shiftable comb-like holder is shifted, suitably in the longitudinal direction relative to the other comb-like holders to the plane mounted by the contact surfaces of the respective mounting gap of the two comb-like holders, by a distance equal to the clearance existing between the surface of the solar wafer facing away from the contact surfaces and the contact surface-parallel guiding surface of the outer contour $u_S$ of the mounting gap of each of the fixed comb-like holders.

The elongated comb-like web of the shiftable comb-like holder can be designed identically to the elongated web of the fixed comb-like holder. As an alternative, the mounting gaps of the elongated web of the shiftable comb-like holder can be U-shaped when viewed in longitudinal section.

Preferred embodiments of the mounting device according to the invention will now be described drawing reference to the drawings. Shown on:

Figure 1:
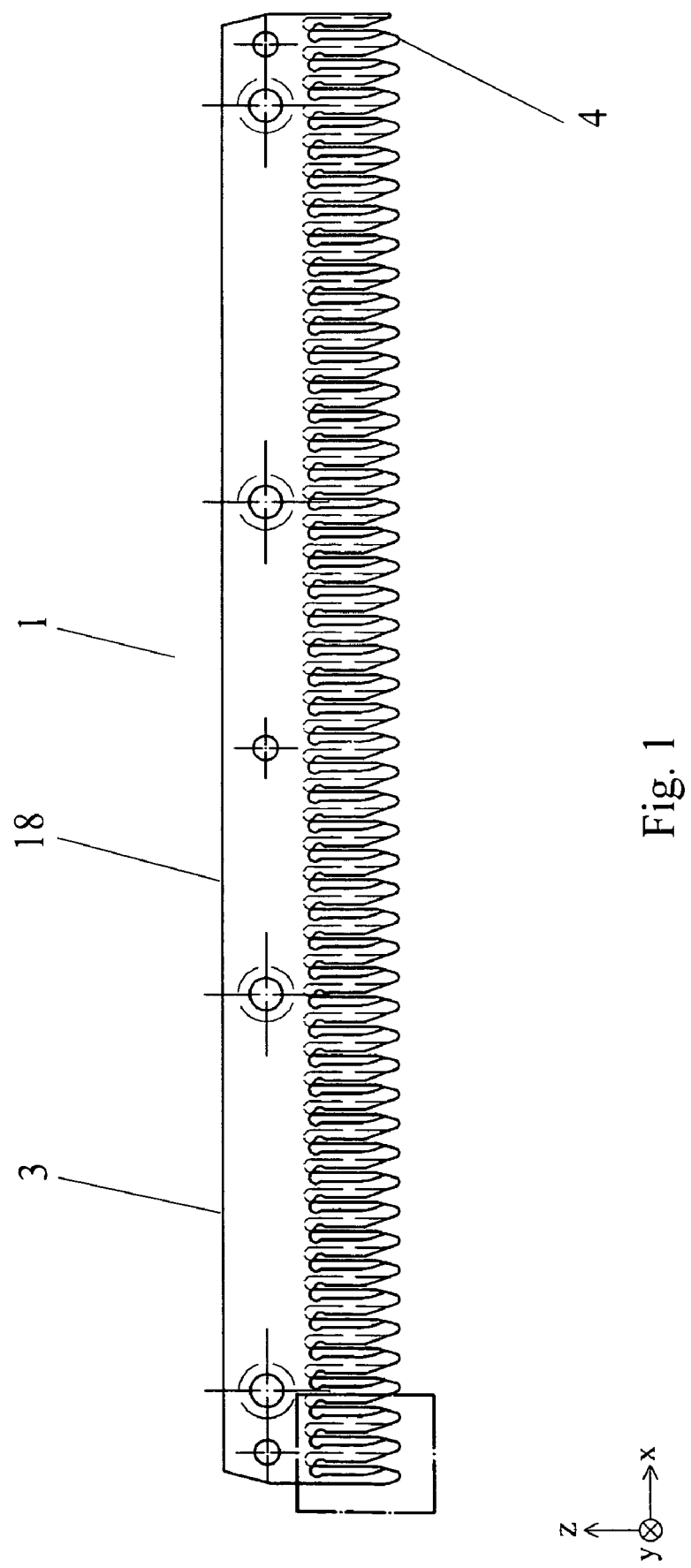
FIG. 1 is a top view of a longitudinal side of a comb-like holder of an embodiment of the mounting device.
Figure 4:
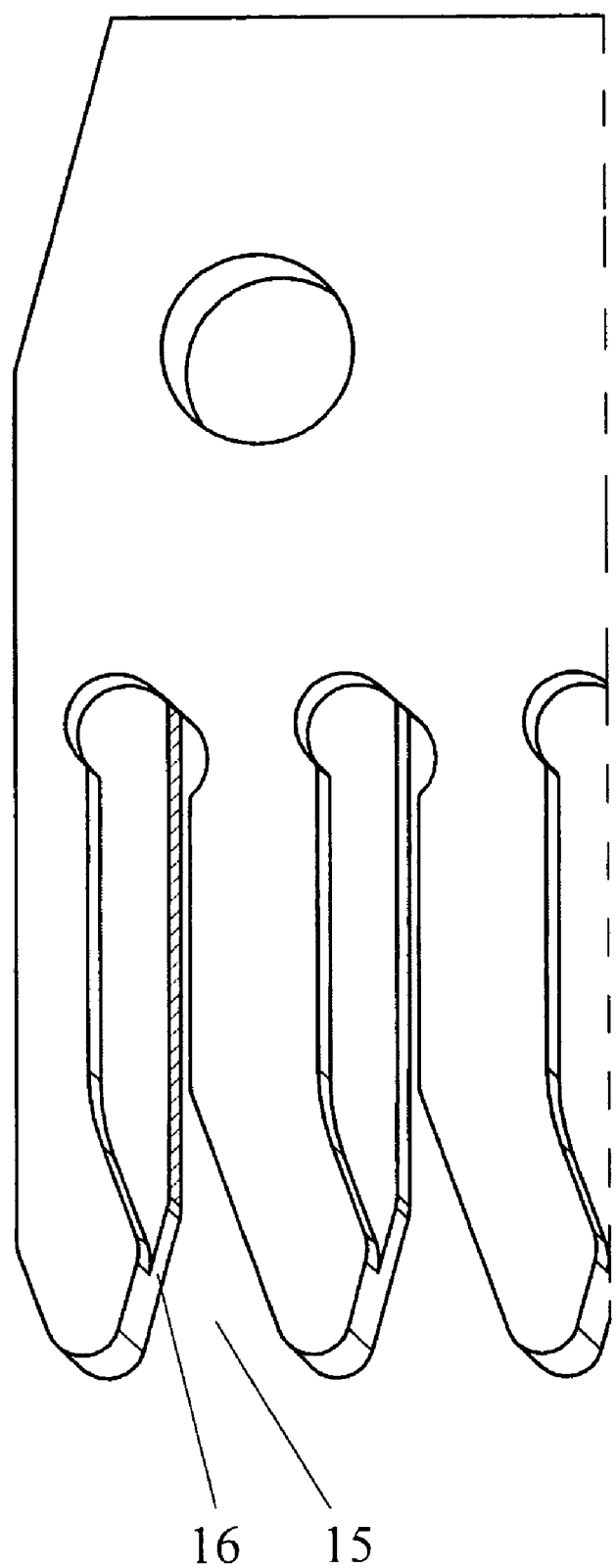
Figure 5:
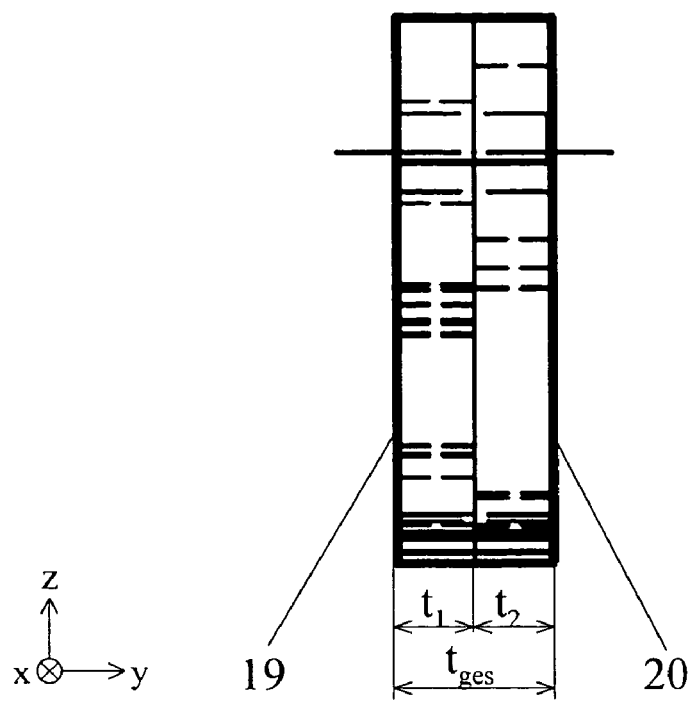
Figure 6:
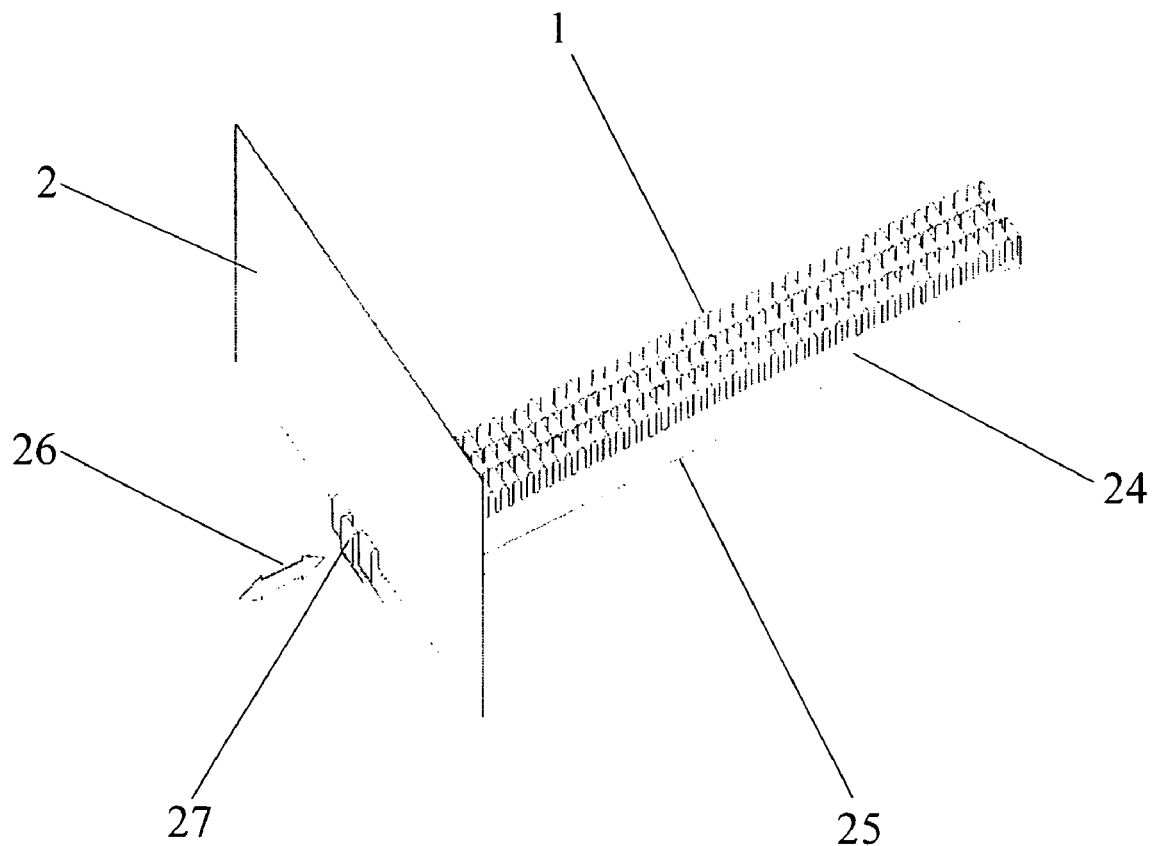

FIG. 4 is a perspective view of the detail of the comb-like holder denoted on FIG. 1, viewed from the right on the longitudinal side of the comb-like holder, and on FIG. 5 is a view of a section perpendicular to the longitudinal direction of another embodiment of the comb-like holder, which consists of two components, and FIG. 6 is a perspective view of another embodiment of the mounting device with a solar wafer in a mounted position, in which the solar wafer is fixed backlash-free.

A first embodiment of the mounting device for disk-shaped substrates such as solar wafers 2 consists of two identically designed comb-like holders 1 of the kind visible from FIGS. 1 to 4, which are to be spaced parallel apart and aligned precisely relative to each other in the longitudinal profile. The distance between the two comb-like holders can be smaller than the length of the lower edge 21 of the solar wafer 2, which is to be mounted in mutually corresponding mounting gaps 9 of the webs 3 of the two comb-like holders 1.

As evident from FIGS. 1 to 4, the comb-like holder 1 has a web 3, on which along the longitudinal extension thereof in the direction of the X-axis a plurality of comb elements 4 arranged at an equal distance from each other are provided. The comb elements 4 relative to the longitudinal extension of the web 3 protrude in the direction of the Z-axis over a uniform height and exhibit an identical total depth $t_{ges}$ corresponding to the width b of the elongated web 3 perpendicular—in the direction of the Y-axis—to the plane formed by the X and Z-axis.

Figure 2:
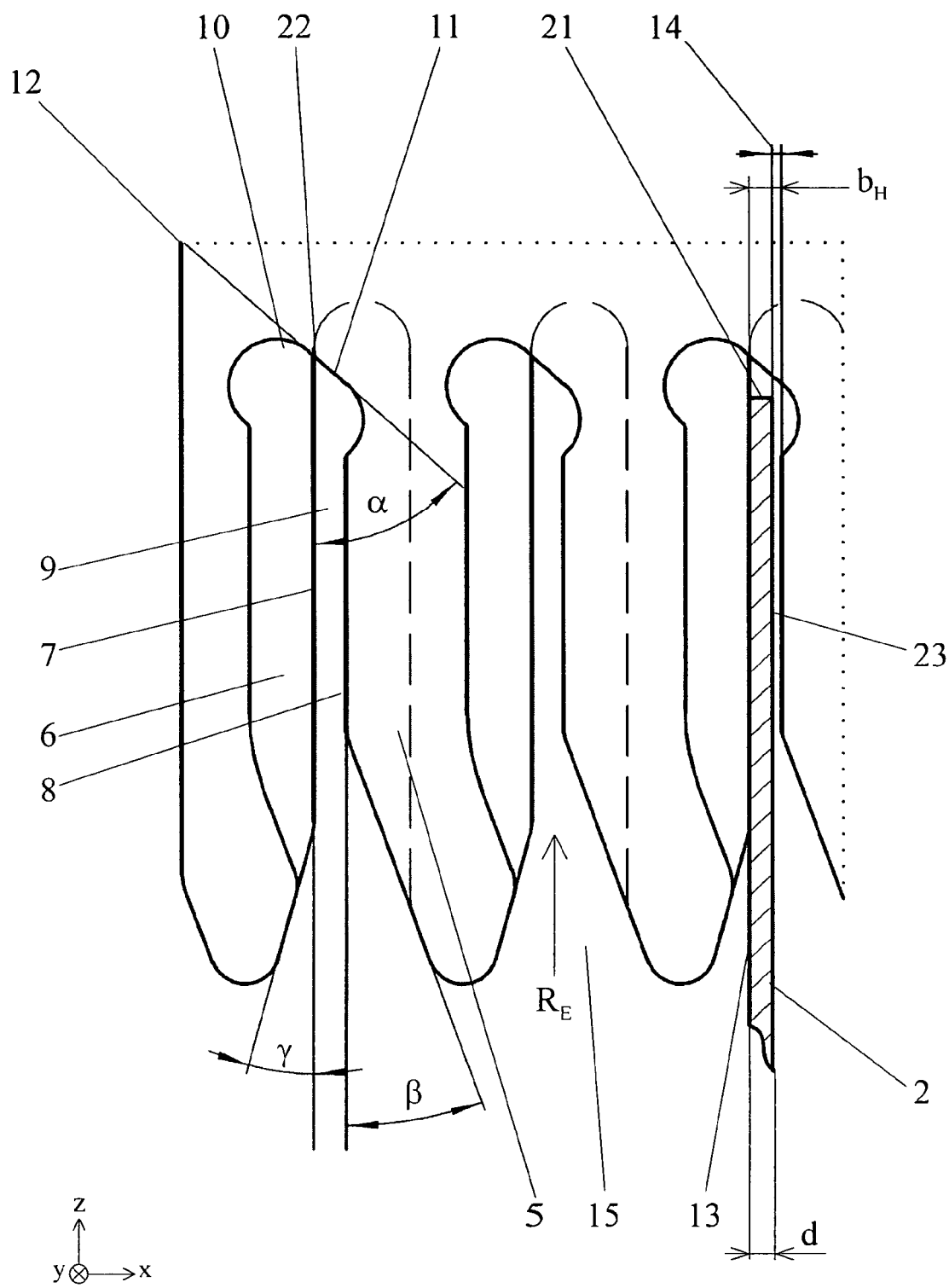
FIG. 2 is a sectional view of a detail denoted on FIG. 1 at the left ends of the comb-like holder, wherein a solar wafer is depicted in a mounting gap.
Figure 3:
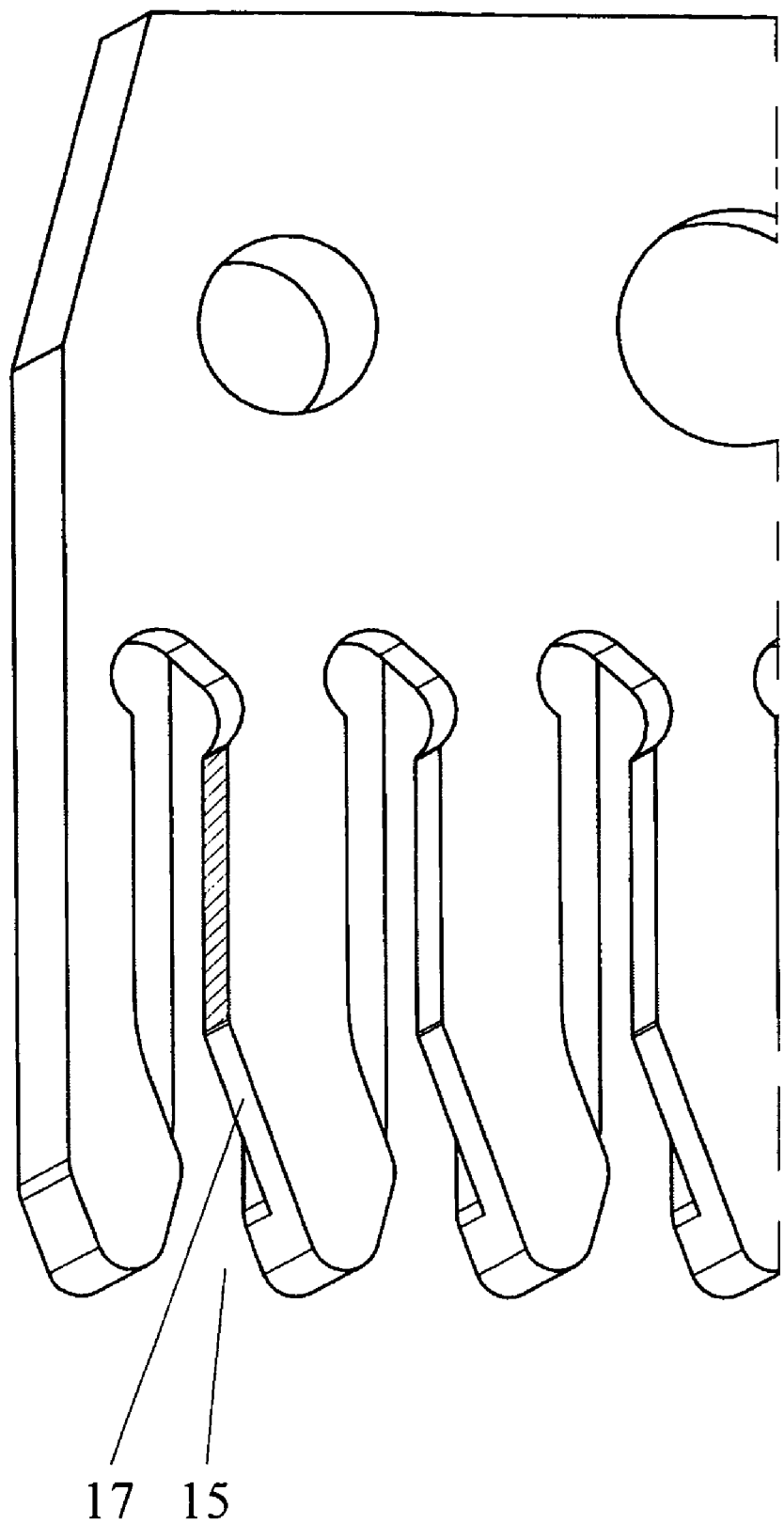
FIG. 3 is a perspective view of the detail of the comb-like holder denoted on FIG. 1, viewed from the left front on the longitudinal side of the comb-like holder.

As illustrated in particular by FIG. 2, a first recess 5 with an outer contour $uA1$ and a second recess 6 with an outer contour $uA2$ are provided between the neighboring comb elements 4, which are offset relative to each other in the direction of the X-axis. The depth $t_1$ and depth $t_2$ of the first recess 5 or second recess 6 are each smaller than the total depth $t_{ges}$ of each comb element 4, and together form the total depth $t_{ges}$ of each comb element 4. The depth $t_1$ and depth $t_2$ of the first recess 5 or second recess 6 can be identical.

Offsetting the first recess 4 and second recess 5 in the direction of the X-axis relative to each other forms a mounting gap 9 of arbitrary width $b_H$ of an outer contour $u_S$ between the neighboring comb elements 4, which has a contact surface 7 and a guiding surface 8 for the solar wafer 2 to be accommodated in the mounting gap 9. The contact surface 7 and guiding surface 8 are arranged relative to each other and parallel to the middle axis A of the outer contour $u_{A1}$ and the outer contour $u_{A2}$ of the first recess 5 or the second recess 5 or 6, wherein the middle axis A essentially runs in the direction of the Z-axis. Measured in the direction of the X-axis, the width $b_H$ of the mounting gap 9 is equal to the thickness d of the solar wafer 2 plus a tolerance 14.

The outer contour $u_{A2}$ of the second recess 6 has a groove 10 on the web side with a slanted surface section 11 on the web side lying in a plane 12 that runs in an inclined manner at a predetermined acute angle $\alpha$ relative to the plane 13 of the contact surface 7 of the outer contour $u_S$ of the mounting gap 9. The selected angle $\alpha$ can range from 46° to 50°, depending on the material pairing of the web 3 and the solar wafer 2.

As best visible from FIGS. 2 and 4, the outer contour $u_S$ of the mounting gap 9 expands like a funnel into an opening area 15 of the outer contour $u_{A1}$ of the first recess 5 between the corresponding neighboring comb elements 4, opposite the insertion direction $R_E$ of the solar wafer 2 into the mounting gap 9. Viewed in the longitudinal section of the comb-like holder 1 (FIG. 2), this opening area 15 is bordered by surfaces 16 and 17 of the neighboring comb elements, which abut the guiding surface 8 or contact surface 7 of the outer contour $u_S$ of the mounting gap 9. The surface 16 is preferably outwardly guided at an acute angle (β) which lies within a range of 18° to 22° to the guiding surface 8. The surface (17) is preferably outwardly guided at an acute angle (γ), which lies within a range of 13° to 17° to the contact surface (7). The opening area of the outer contour $u_{A2}$ of the second recess 6 having the groove 10 on the web side is designed as a stepped hole.

When the lower edge 21 of the solar wafer 2 to be introduced into the mounting gap 9 engages with the slanted surface section 11 of the groove 10 of the outer contour uA2 of the second recess 6, the solar wafer 2 on the slanted surface section 11 is glidingly shifted downward into a predetermined position in the force of gravity while overcoming static friction, in which the solar wafer 2, upon rotating the comb-like holder 1 around a predetermined acute angle ϕ relative to the vertical line on the contact surface 7 of the outer contour $u_S$ of the mounting gap 9, is brought with its surface 13 facing the latter in planar contact on the contact surface 7, and in which there is simultaneously provided a tolerance 14 between the surface 22 of the solar wafer 2 facing away from the contact surface 7 and the guiding surface 8 of the outer contour $u_S$ of the mounting gap 9 running parallel to the contact surface 7. The acute angle ϕ usually measures 3°. It is also possible to ensure planar contact between the solar wafer 2 and contact surface 7 while shifting the lower edge 21 of the solar wafer on the slanted surface section 11 of the groove 10 of the second recess 6 by fabricating the lower longitudinal edge 18 of the web 3 of the comb-like holder 1 in advance to be inclined at an acute angle of ϕ=3° relative to the vertical line on the contact surface 7 of the outer contour $u_S$ of the second recess 6.

In the embodiment of the comb-like holder 1 presented on FIG. 5, there are two components 19 and 20 that can be milled separately and simultaneously, the outer contour $u_{19}$ or $u_{20}$ of which corresponds to the respective outer contour $u_{Schnitt}$ of the two defined sheet metal blanks of the comb-like holder 1 given a longitudinal section of the latter, when the plane of the longitudinal section runs parallel to the X-axis at $y=t_1$ or $y=t_{ges}-t_w$, which are detachably secured to each other while abutting in a planar manner at their facing longitudinal sides.

FIG. 6 shows an embodiment of the mounting device with which the solar wafer 2 held by the latter can be fixed in a backlash-free position. This embodiment provides parallel identical comb-like holders 1 spaced apart from each other, the elongated web 3 of which is designed below as a single piece with a final connecting base section 24 with a planar bottom surface 25. Centrally arranged between the two fixed comb-like holders 1 in the upper surface of the base section 24 is a guide that runs in their longitudinal direction, in which the elongated web 3 of the shiftable comb-like holder 27, with its lower longitudinal edge 18 parallel and aligned in longitudinal profile relative to the respective elongated web 3 of the two outer comb-like holders 1, can be controllably guided to and fro, as denoted by the double arrow 26 on FIG. 6. For example, a robot can be used to control the process of shifting the shiftable holder 27 in the longitudinal direction from a base position, in which, to accommodate the solar wafer 2, the corresponding mounting gap 9 of the shiftable comb-like holder 27 is aligned with the respectively corresponding mounting gap 9 of the two outer comb-like holders 1, into the position in which the solar wafer 2 is fixed backlash-free by the two comb-like holders 1 and the shiftable comb-like holder 27, and back into the base position. In the backlash-free, fixed position of the solar wafer 2, the shiftable comb-like holder 27 is shifted from the base position in the longitudinal direction relative to the two comb-like holders 1 to the plane mounted by the contact surfaces 7 of the respectively corresponding mounting gap 9 of the two comb-like holders 1, by a distance equal to the clearance 14 existing between the surface 22 of the solar wafer 22 facing away from the contact surfaces 7 and the respective contact surface 7-parallel guiding surface 8 of the outer contour $u_S$ of the mounting gap 9 of each of the two comb-like holders 1.

LIST OF REFERENCE NUMBERS

1 Comb-like holder
2 Solar wafer
3 Web
4 Comb element
5 First recess
6 Second recess
7 Contact surface
8 Guiding surface
9 Mounting gap
10 Web-side groove
11 Web-side slanted surface section of groove
12 Plane of web-side surface section of groove
13 Solar wafer surface facing the contact surface
14 Tolerance
15 Opening area
16 Surface bordering the contact surface
17 Surface bordering the guiding surface
18 Lower longitudinal edge of the web
19 First component
20 Second component
21 Lower edge of solar wafer
22 Predetermined position in the web-side slanted surface section of the groove
23 Solar wafer surface facing away from the contact surface
24 Base section
25 Bottom surface of base section
26 Dual direction arrow for the shiftability of the shiftable comb-like holder
26 Shiftable comb-like holder
$u_A$ Outer contour of a recess
A Middle axis of the recess with outer contour uA
$u_{A1}$ Outer contour of the first recess
$u_{A2}$ Outer contour of the second recess
$u_S$ Outer contour of the mounting gap
$u_{Schnitt}$ Outer contour of the sheet metal blanks
$u_{19}$ Outer contour of the first component
$u_{20}$ Outer contour of the second component
$t_1$ Depth of the first recess
$t_2$ Depth of the second recess
$t_{ges}$ Total depth of the comb element
b Width of the web
$b_H$ Width of the mounting gap
d Thickness of the solar wafer
$R_E$ Insertion direction of the solar wafer into the mounting gap
α Angle of inclination of the plane of the web-side surface section
β Angle of inclination of the surface neighboring the guiding surface
γ Angle of inclination of the surface neighboring the contact surface
ϕ Angle of inclination of the lower longitudinal edge of the web

The invention claimed is:

1. A mounting device for disk-shaped substrates with at least one comb-like holder (1) having an elongated web (3), on which along the longitudinal extension (X-axis) thereof arranged at equal distances from each other are provided, which relative to the longitudinal extension of the web (3) protrude perpendicularly (Z-axis) over a uniform height and exhibit an identical total depth $t_{ges}$ corresponding to the width of the elongated web perpendicular (Y-axis) to the plane formed by the X and Z axis, wherein between the surfaces of neighboring comb elements (4) facing each other at least one recess (5 or 6) for the solar wafer (2) to be mounted is formed with an outer contour ($u_A$), the middle axis (A) of which runs in the direction of the Z-axis, and which exhibits a contact surface (7) and a guiding surface (8), which are arranged relative to each other and parallel to the middle axis (A) of the recess (5 or 6), for the solar wafer (2) to be mounted in the recess (5 or 6), characterized in that, a mounting gap (9) is provided between the respective neighboring comb elements (4) of the elongated web (3) of the at least one comb-like holder (1), the outer contour ($u_S$) of which comprises the contact surface (7) and guiding surface (8) for the solar wafer (2) to be accommodated in the mounting gap (9), formed in the direction of the X-axis with an arbitrary width ($b_H$) by two recesses (5 and 6) offset relative to each other in the direction of the X-axis, which have an outer contour ($u_{A1}$ or $u_{A2}$), and a respective depth ($t_1$) or ($t_2$) smaller than the total depth ($t_{ges}$) of each comb element (4), wherein the depth ($t_1$) and the depth ($t_2$) form the respective total depth ($t_{ges}$) of each comb element (4), and the outer contour ($u_{A1}$ or $u_{A2}$) has a groove (10) on the web side with a slanted surface section (11) on the web side that is located in a plane (12) running in an inclined manner at an acute angle ($\alpha$) relative to the plane (13) of the contact surface (7) of the outer contour ($u_S$) of the mounting gap (9) such that the solar wafer (2) to be introduced into the mounting gap (9), when its lower edge (21) engages with the slanted surface section (11) of the groove (10) of the outer contour ($u_{A1}$ or $u_{A2}$), is to be glidingly shifted thereon into a predetermined position under the force of gravity while overcoming static friction, in which the solar wafer (2), upon rotating the comb-like holder (1) around a predetermined acute angle ($\phi$) relative to the vertical line on the contact surface (7) of the outer contour ($u_S$) of the mounting gap (9), is brought with its surface (13) facing the latter in planar contact on the contact surface (7), and in which there is simultaneously provided a tolerance (14) between the surface (22) of the solar wafer (2) facing away from the contact surface (7) and the guiding surface (8) of the outer contour ($u_S$) of the mounting gap (9) running parallel to the contact surface (7).

2. The mounting device according to claim 1, wherein the depth ($t_1$) and the depth ($t_2$) of the first recess (5) or second recess (6) are identical.

3. The mounting device according to claim 1, wherein the acute angle ($\alpha$) at which the plane (12) of the web-side surface section (11) of the web-side groove (10) of the outer contour ($u_{A1}$ or $u_{A2}$) of the first or second recess (5 or 6) runs relative to the plane (13) of the contact surface (7) of the outer contour ($u_S$) of the mounting gap (9) is in the range of 46° to 50°.

4. The mounting device according to claim 1, wherein the outer contour ($u_S$) of the mounting gap (9) expands like a funnel into an opening area (15) opposite to the introduction direction ($R_E$) of the disk-shaped substrates (2) into the mounting gap (9) by having the respective surfaces (16 or 17) of the neighboring comb elements (14), which are respectively adjacent to the guiding surface (8) and contact surface (7) of the outer contour ($u_S$) of the mounting gap (9) and border the opening area (15), be outwardly guided in the opening area (15) at an acute angle ($\beta$) ranging from 18° to 22° relative to the guiding surface (8) and an acute angle ($\gamma$) ranging from 13° to 17° relative to the contact surface (7), as viewed in the longitudinal section of the comb-like holder (1).

5. The mounting device according to claim 1, wherein the lower longitudinal edge (18) of the web (3) is inclined at an acute angle ($\phi$) of 3° relative to the vertical line on the contact surface (7) of the outer contour ($u_S$) of the mounting gap (9).

6. The mounting device according to claim 1, wherein the web (3), on which along the longitudinal extension thereof a plurality of comb elements (14) are provided at an equal distance from each other, is fabricated in such a way by machining a blank having the exterior dimensions of the comb-like holder (1) to be manufactured that a single milling cutter can be used to completely fabricate the milling contour of the comb-like holder (1), initially in part starting from the one longitudinal side of the blank in the direction of the Y-axis to a depth ($t_1$), and after subsequently turning the partially milled blank by 180° around the Z-axis, completely fabricate the milling contour in the direction of the Y-axis to a depth ($t_2$) from its other longitudinal side.

7. The mounting device according to claim 6, characterized in that the blank consists of plastic, light metal or alloy of the latter.

8. The mounting device according claim 1, characterized by two components (19 and 20) to be separately milled simultaneously, the outer contour of which ($u_{19}$ or $u_{20}$) respectively corresponds to the outer contour $u_{Schnitt}$ of the two defined components (19 and 20) of the comb-like holder (1) given a longitudinal section of the latter, when the plane of the longitudinal section runs parallel to the X-axis at $y=t_1$ or $y=t_{ges}-t_2$, and which are detachably secured to each other while abutting in a planar manner at their facing longitudinal sides.

9. The mounting device according to claim 8, characterized in that the two components (19 and 20) are screwed together.

10. The mounting device according to claim 1, characterized by at least one pair of the comb-like holder (1), wherein the elongated webs (3) of the two identically designed comb-like holders (1) are arranged parallel at a distance from each other and aligned precisely relative to each other in the longitudinal profile.

11. The mounting device according to claim 10, characterized in that at least one additional comb-like holder (27) is provided, which is to be shifted in a controlled fashion in the longitudinal direction relative to the other comb-like holders (1) in such a way that the solar wafer (2) mounted in the mutually corresponding mounting gaps (9) of the two fixed comb-like holders (1) and the shiftable comb-like holder (27) can be secured in a backlash-free position by the respective contact surface (7) of the outer contour ($u_S$) of the respectively corresponding mounting gap (9) of the two comb-like holders (1) and the guiding surface (8) of the outer contour ($u_S$) of the corresponding mounting gap (9) of the shiftable comb-like holder (27).

12. The mounting device according to claim 11, characterized in that the elongated web (3) of each of the two mutually spaced apart and identically designed comb-like holders (1) is designed as a single piece with a final connecting base section (24), the upper surface of which incorporates a longitudinally running guide centrally between the two comb-like holders (1), into which the elongated web (3) of the shiftable comb-like holder (27) can be controllably shifted back and forth with its lower longitudinal edge (18) parallel and aligned in longitudinal profile relative to the respective elongated web (3) of the two outlying comb-like holders (1).

13. The mounting device according to claim 11, characterized in that, in the backlash-free position of the solar wafer (2) fixed by the comb-like holders (1; 28), the shiftable comb-like holder (28) is shifted from its base position, in which, to accommodate the solar wafer (2), the corresponding mounting gap (9) of the shiftable comb-like holder (27) is aligned with the respectively corresponding mounting gaps (9) of the two outer comb-like holders (1), in the longitudinal direction relative to the two comb-like holders to the plane mounted by the contact surfaces (7) of the respective mounting gap (9) of the two comb-like holders (1), by a distance equal to the clearance (14) existing between the surface (22) of the solar wafer (2) facing away from the contact surface (7) and the contact surface (7)-parallel guiding surface (8) of the outer contour ($u_S$) of the mounting gap (9) of each of the comb-like holders (1).

14. The mounting device according to claim 11, characterized in that the elongated web (3) of the comb-like holder (1) and the elongated web (3) of the shiftable comb-like holder (28) are identical in design.

15. The mounting device according to claim 11, characterized in that the mounting gap (9) of the elongated web (3) of the shiftable comb-like holder (28) are U-shaped viewed in the longitudinal section.

* * * * *